United States Patent [19]
Sasaki

[11] Patent Number: 5,031,133
[45] Date of Patent: Jul. 9, 1991

[54] FIR DIGITAL FILTER FOR HIGH-SPEED COMMUNICATIONS SYSTEMS

[75] Inventor: Eisaku Sasaki, Tokyo, Japan

[73] Assignee: NEC Corporation, Tokyo, Japan

[21] Appl. No.: 480,998

[22] Filed: Feb. 16, 1990

[30] Foreign Application Priority Data

Feb. 16, 1989 [JP] Japan .................................. 1-37486

[51] Int. Cl.[5] .............................................. G06F 7/38
[52] U.S. Cl. .............................................. 364/724.16
[58] Field of Search ....................... 364/724.16, 724.13

[56] References Cited

U.S. PATENT DOCUMENTS 4,691,292 1/1987 Rothweiler .................... 364/724.13
4,777,612 10/1988 Tomimitsu ..................... 364/724.13
4,811,263 3/1989 Hedley et al. .................. 364/724.13
4,821,223 4/1989 David ......................... 364/724.16 X

*Primary Examiner*—Gary V. Harkcom
*Assistant Examiner*—Tan V. Mai
*Attorney, Agent, or Firm*—Sughrue, Mion, Zinn, Macpeak & Seas

[57] ABSTRACT

A Finite Impulse Response (FIR) filter comprising (2n+1) successive virtual taps having virtual tap weight coefficients $c_j$, where $n \geqq 2$ and $1 \leqq j \leqq 2n+1$, and $c_j = c_{2n+2-j}$. Tap weight multipliers are connected to the input terminal of the filter to form (n+1) successive physical taps and multiply input digital samples $a_i$ with physical tap weight coefficients $d_k$ to produce weighted digital samples, where k is a variable in the range between 1 and n+1, and $d_k = c_{2k-1} + c_{2k} = c_{2(n-k+1)} + C_{2(n-k+1)}$, and $d_{n+1} = c_1 = c_{2n+1}$. First shift registers with delay time T and first adders are alternately series-connected from the output of a first one of the multipliers so that the outputs of the other multipliers are summed with successive outputs of the first shift registers to produce a first output sequence. Second shift registers with delay time T and second adders are alternately series-connected from the output of a last one of the multipliers so that the outputs of the other tap weight multipliers are summed with successive outputs of said second shift register to produce a second output sequence. The first output sequence is sampled at intervals T for a first half duration the second output sequence is sampled at intervals T for a second half duration and multiplexed with the sampled first output sequence into a sequence of output digital samples for coupling to the output terminal of the filter.

2 Claims, 4 Drawing Sheets a_I
c1
c2
c3
c4
c5
31
32
33
34
35
D
36
37
38
39
CLOCK AT 2f_s
Σ
40
b_I (a)
(b)
time
t1
t2
t3
t4
a1
a2
a3
a4
c1
c2
c3
c4
c5
1/f_s
1/2f_s
b1
b2
b3
b4
time CLOCK SOURCE (fs)
20
10
ai
d1
d2
d3
1
2
3
D
4
Σ
5
D
6
Σ
7
D
8
Σ
9
D
10
Σ
11
SW
12
21
d1ai-1
d1ai-1 + d2ai
d3ai
d3ai-1
d3ai-1 + d2ai
d3ai-2 + d2ai-1
Ai = d1ai-2 + d2ai-1 + d3ai
Bi = d3ai-2 + d2ai-1 + d1ai

FIR DIGITAL FILTER FOR HIGH-SPEED COMMUNICATIONS SYSTEMS

TECHNICAL FIELD

The present invention relates generally to digital filters, and more specifically to a high-speed digital filter suitable for digital radio transmission systems.

BACKGROUND OF THE INVENTION

Due to the sharp cutoff capability and high cost performance, digital filters are increasingly used in many applications, instead of analog filters. digital filters are of two types, i.e., IIR (infinite impulse response) filter and FIR (finite impulse response) filter. For digital radio, FIR low-pass filters are employed because of their linear operating characteristic for input-output phase relationship. Since the shift registers that comprise a digital filter are the primary source of aliasing, or fold-over distortion noise, they are clocked at twice the symbol rate for oversampling the incoming signal. The clock rate of the shift registers thus determines the maximum operating speed of a digital filter. If higher transmission speed is desired for a system, the clock rate of the digital filters must be increased. However, the operating speed of a digital filter is limited to the maximum operating speed of the integrated circuit components that comprise the shift registers and other constituent parts of the filter.

One approach would be to design a digital filter with two parallel subsystems each being operated respectively on two clock sequences each being out of phase by $\pi$ radian with respect to the other. However, the hardware cost of the filter is twice as much as the current FIR digital filter.

SUMMARY OF THE INVENTION

It is therefore an object of the present invention to provide a finite impulse response digital filter which is capable of operating at higher speeds to meet the high speed requirement of digital communications systems with reduced tap weight multipliers.

According to the present invention, there is provided a finite impulse response digital filter for a digital communications system. The filter has (2n+1) successive virtual taps respectively having virtual tap weight coefficients $c_j$, where n is equal to or greater than 2 and j is in the range between 1 and 2n+1. The tap weights have symmetric values with respect to the center tap point value $c_{m+1}$, and therefore, a relation $c_j=c_{2n+2-j}$ holds.

The filter includes (n+1) tap weight multipliers connected to the input terminal of the filter for forming (n+1) successive physical taps and multiplying input digital samples $a_i$ with physical tap weight coefficients $d_k$ to produce weighted digital samples, where $1\leqq k\leqq n+1$, and $c_j=c_{2n+2-j}$, and $d_k=c_{2k-1}+c_{2k}=c_{2(n-k+1)}+c_{2(n-k+1)}+1$, and $d_{n+1}=c_1=c_{2n+1}$, and $a_i$ is an input digital sample at a given instant of time, and $a_{i+1}$ is an input digital sample displaced by an interval T with respect to the digital sample $a_i$and T is the reciprocal of the symbol rate of the input digital samples. A first delay-and-adder circuit is formed by a series circuit of first delaying elements with delay time T and first summing elements which are alternately connected from the output of a first one of the tap weight multipliers. The outputs of the other tap weight multipliers are summed by the first summing elements with successive outputs of the first delaying elements to produce a first output sequence of digital samples $d_1\times a-n+d_2\times a_{i-n+1}+\ .\ .\ .\ +d_{n+1}\times a_i$. A second delay-and-adder circuit is formed by a series circuit of second delaying with delay time T and second summing elements which are alternately connected from the output of the (n+1)th multiplier. The outputs of the other tap weight multipliers are summed by the second summing elements with successive outputs of the second delaying elements to produce a second output sequence of digital samples $d_{n+1}\times a_{i-n}+d_n\times a_{i-n+1}+d_2\times a_{i-1}+d_1\times a_i$. The first output sequence is sampled at intervals T for a first half duration and the second output sequence is sampled at intervals T for a second half duration and multiplexed with the sampled first output sequence into a single sequence for coupling to an output terminal of the digital filter.

BRIEF DESCRIPTION OF THE DRAWINGS

The present invention will be described in further detail with reference to the accompanying drawings, in which.

DETAILED DESCRIPTION

Figure 1:
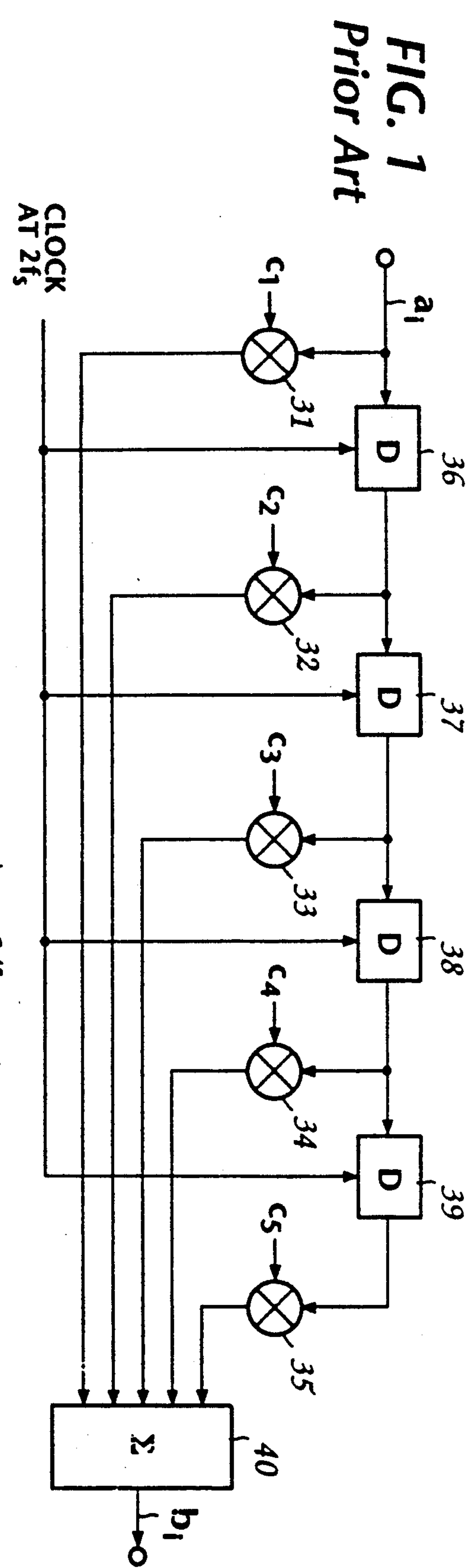
FIG. 1 is a block diagram of a prior art digital filter.
Figure 2:
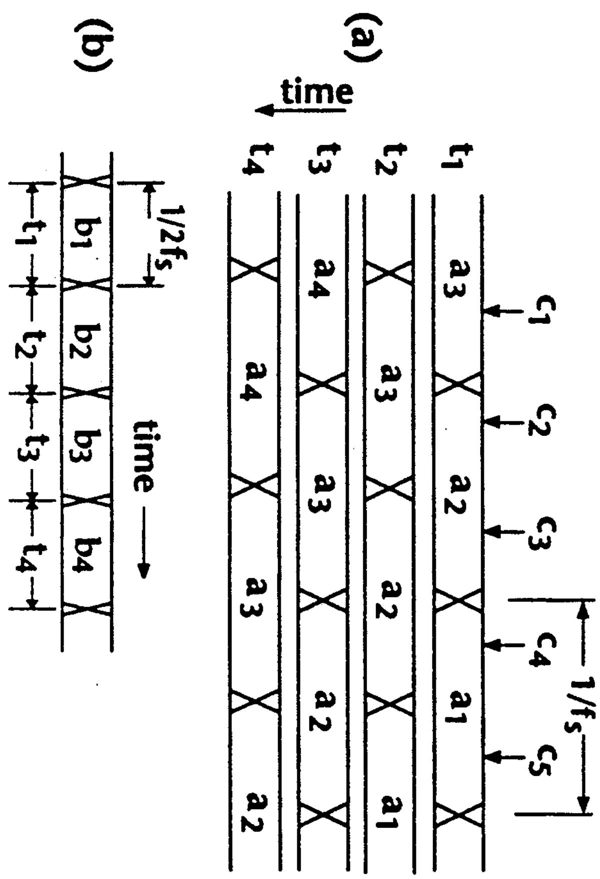
FIG. 2 is a timing diagram associated with the prior art digital filter.

Before going into the details of the present invention, it is appropriate to describe a prior art FIR digital filter having an odd-number of tap weight coefficients. In FIG. 1, input digital samples with a symbol rate $f_s$ are supplied to the tapped delay line consisting of shift registers 36 to 39 defining successive tap points to which tap weight multipliers 31 to 35 are respectively connected. Shift registers 36 to 39 are clocked at twice the symbol rate fs to oversample the incoming signal. The successively delayed digital samples are multiplied with tap weight coefficients $c_1$ to $c_5$ respectively by the multipliers and summed altogether by an adder 40 to produce an output sequence $b_i$. The filter has a roll-off characteristic which is symmetric with respect to the center tap. Therefore, the relations $c_1=c_5$ and $c_2=c_4$ hold. Since shift registers 36–39 are driven at twice the speed of digital samples travelling through the tapped delay line, a digital sample $a_1$ appears at the inputs of multipliers 34 and 35 at a given instant $t_1$ as illustrated in part (a) of FIG. 2, and similarly a succeeding digital sample $a_2$ appears at the inputs of multipliers 32 and 33 and the next sample $a_3$ appears solely at the input of multiplier 31. The summation of these multiplied digital samples results in an output sample $b_1$ of duration $\frac{1}{2}f_s$ as indicated in part (b) of FIG. 2. At time $t_2$ which is displaced by interval $\frac{1}{2}f_s$ with respect to $t_1$, digital sample $a_1$ appears only at the input of multiplier 35, and digital sample $a_2$ appears at the inputs of multipliers 33 and 34 and digital sample $a_3$ appears at the inputs of multipliers 31 and 32, resulting in an output sample $b_2$. In like manner, at time $t_3$, digital samples $a_2$ and $a_3$ appear simultaneously at the inputs of multipliers 34, 35 and 33 and 32, with digital sample $a_4$, samples $a_3$ and $a_4$ appear simultaneously at the inputs of multipliers 34, 33 and 32 and 31, with sample $a_2$ appearing solely at the input of multiplier 35.

Therefore, the output digital samples $b_1$ can be represented as follows:

$$b_1-(c_4+c_5)a_1(c_2+c_3)a_2+c_1\times a_3$$

$$b_2=c_5\times a_1+(c_3+c_4)a_2+(c_1+c_2)a_3$$

$$b_3+(c_4+c_5)a_2+(c_2+c_3)a_3+c_1\times a_4$$

$$b_4+c_5\times a_2+(c_3+c_4)a_3+(c_1+c_2)a_4$$

It is seen that like tap weight coefficients appear cyclically at sampling intervals $\frac{1}{2}f_s$. If the following is given:

$$d_1=c_4+c_5$$

$$d_2=c_2+c_3$$

$$d_3=c_1$$

$b_1$ and $b_3$ can be represented as:

$$b_1=d_1\times a_1+d_2\times a_2+d_3\times a_3$$

$$b_3=d_1\times a_2+d_2\times a_3+d_3\times a_4$$

Since $c_5=c_1$ and $c_4=c_2$, $d_1$, $d_2$ and $d_3$ are also given by:

$$d_1=c_1+c_2$$

$$d_2=c_3+c_4$$

$$d_3=c_5$$

Therefore, $b_2$ and $b_4$ can be represented as follows:

$$b_2=d_3\times a_1+d_2\times a_2+d_1\times a_3$$

$$b_4=d_3\times a_2+d_2\times a_3+d_1\times a_4$$

In general terms, for $(2n+1)$ virtual tap weight coefficients $c_j$, (where $n\geqq 2$ and $1\leqq j\leqq 2n+1$), $c_j$ is equal to $c_{2n+2-j}$, and combined (physical) tap weight coefficients $d_k$ can be represented by $d_k=c_{2k-1}+c_{2k}=c_{2(n-k+1)}+c_{2(n-k+1)+1}$, and $d_{n+1}=c_1=c_{2n+1}$.

It follows from the foregoing that the output of the digital filter can be divided into first and second groups. In the first group, output samples are sequentially multiplied by tap weights $d_1$, $d_2$ and $d_3$ according to their order of occurrence, while in the second group, output samples are sequentially multiplied by the tap weights in sequence which is opposite to the order of occurrence of the first group.

Figure 3:
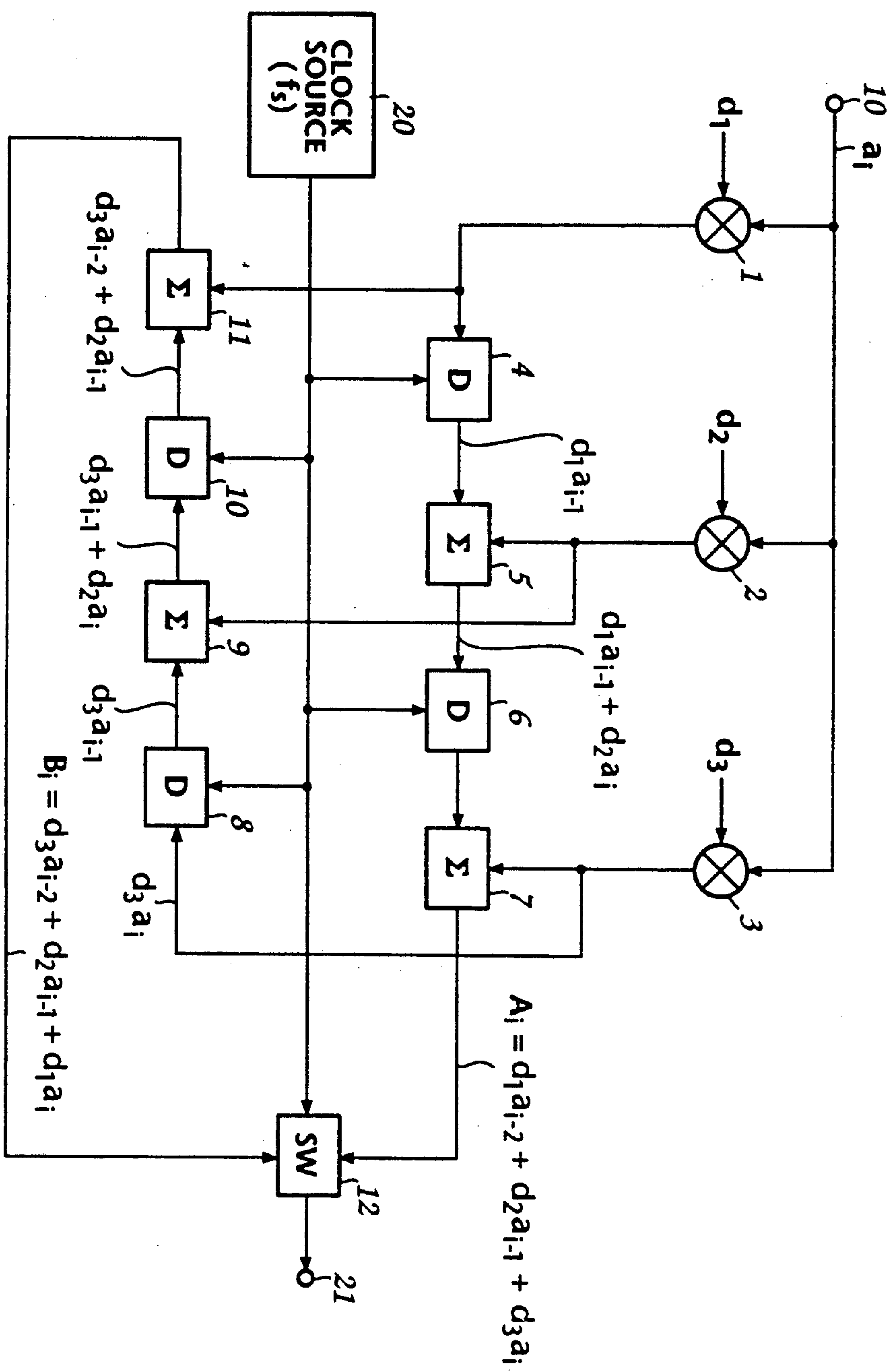
FIG. 3 is a block diagram of a digital filter according to a first embodiment of the present invention.

Referring now to FIG. 3, there is shown in FIR digital filter according to the present invention. The digital filter of the present invention has at least five virtual tap weights which are represented by at least three physical tap weights $d_1$, $d_2$ and $d_3$ just described, and is so constructed that it generates output samples $b_1$ and $b_3$ which appear in a first output sequence $A_1$ at alternate intervals with output samples $b_2$ and $b_4$ which appear in a second output sequence $B_1$.

An input digital sample $a_1$ at symbol rate $f_s$ is applied to an input terminal 10 to which are connected the input terminals of tap weight multipliers 1, 2 and 3 having tap weight coefficients $d_1$, $d_2$ and $d_3$, respectively. For generating the output sequences $A_1$ and $B_1$, first and second delay-and-adder circuits are provided. The first delay-and-adder circuit comprises a shift register 4, an adder 5, a shift register 6 and an adder 7. The second delay-and-adder circuit comprises a shift register 8, and adder 9, a shift register 10 and an adder 11, all of which are connected in order opposite to that of the first delay-and-adder circuit. All shift registers 4, 6, 9 and 10 are clocked by a clock source 20 at intervals $T=1/f_s$.

The output terminal of multiplier 1 is connected to the input of shift register 4 and to an input terminal of adder 11. Shift register 4 delays the input digital sample for a duration T equal to the reciprocal of the symbol rate $f_s$ and produces a digital output sample $d_1\times a_{i-1}$ which is supplied to an input of adder 5 to which the output of multiplier 2 is supplied. Therefore, adder 5 produces an output sample $d_1\times a_{i-1}+d_2\times a_i$ which is applied to and delayed for interval T by shift register 6 for introduction of a further delay, producing an output sample represented by $d_1\times a_{i-2}+d_2\times a_{i-1}$. Adder 7 sums the output of shift register 6 with the output of multiplier 3, generating an output $A_i$ represented by a sum of samples $d_1\times a_{i-2}+d_2\times a_{i-1}+d_3\times a_i$ at one input of a switch 12.

Figure 4:
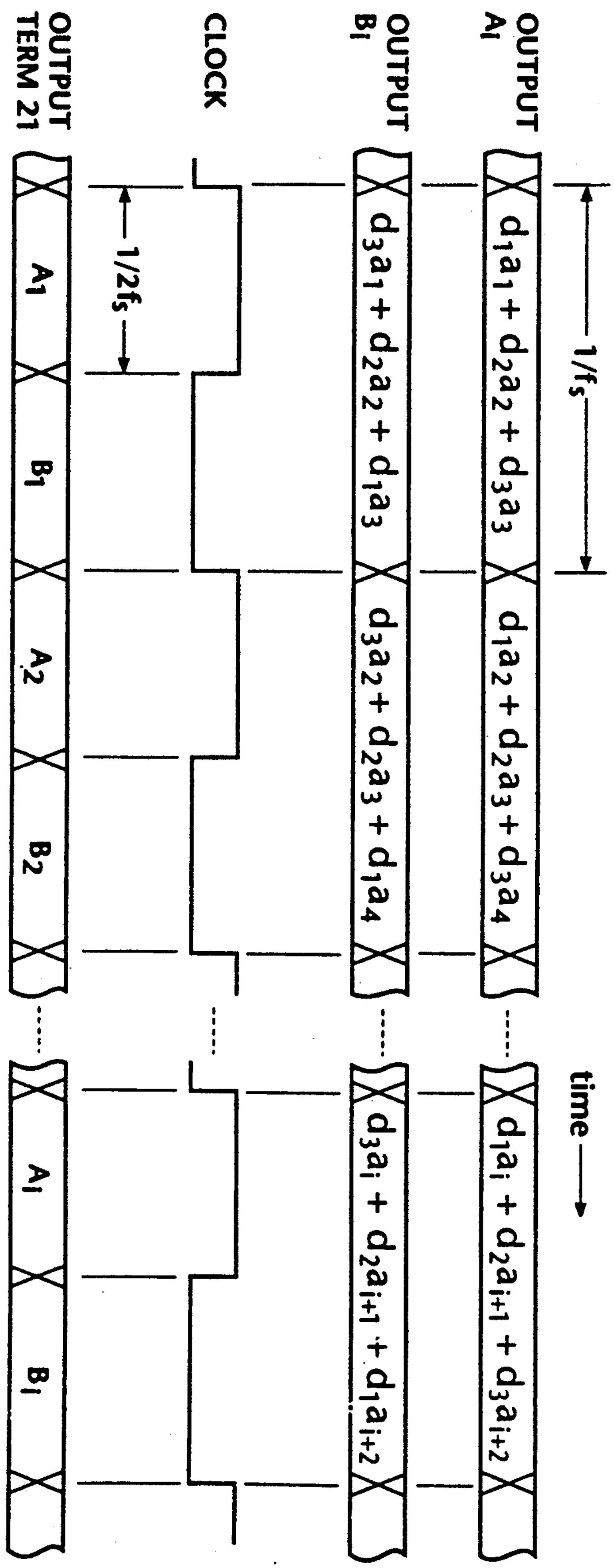
FIG. 4 is a timing diagram useful for describing the operation of the present invention.

As illustrated in FIG. 4, during a first interval $1/f_s$ the output sequence $A_i$ comprises a sum of $d_1\times a_1$, $d_2\times a_2$ and $d_3\times a_3$ and the output sequence $B_i$ comprises a sum of $d_3\times a_1$, $d_2\times a_2$ and $d_1\times a_3$. during a second interval $1/f_s$, the output sequence $A_i$ comprises a sum of $d_1\times a_2$, $d_2\times a_3$ and $d_3\times a_4$ and the sequence $B_i$ comprises a sum of $d_3\times a_2$, $d_2\times a_3$ and $d_1\times a_4$.

Switch 12 is a sampling means which is driven by the clock source 20 at intervals $T=1/f_s$ to sample the output sequence $A_i$ for a first half duration T/2 and sample the output sequence $B_i$ for a second half duration. The sampled half-duration signals are multiplexed at the output of switch 12 into a single stream and coupled to the filter output terminal 21. As a result, the sampling rate of the digital filter of the invention is one-half the sampling rate of the digital filter of the type as shown in FIG. 3. Since the symbol rate of the incoming signal is equal to the Nyquist rate, and each of the output sequences is sampled for duration $\frac{1}{2}f_s$, the incoming signal is double-oversampled. Therefore, the shift registers are no longer the source of aliasing noise and hence it is not necessary to operate them at twice the symbol rate. The present invention provides a digital filter which is simple in configuration and is capable of processing incoming signals having a symbol rate higher than $f_s$.

Figure 5:
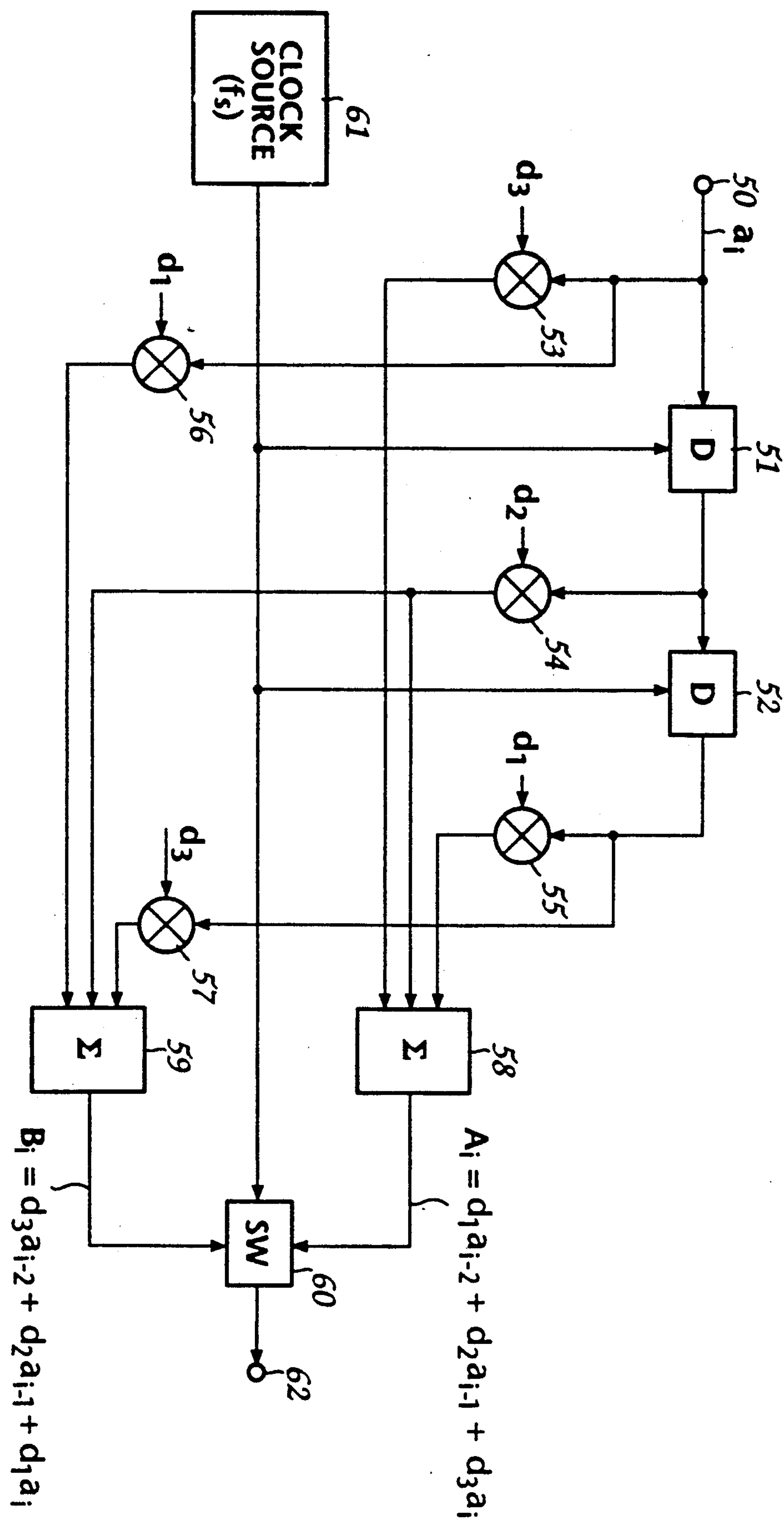
FIG. 5 is a block diagram of a second embodiment of this invention.

FIG. 5 is an illustration of a modified form of the digital filter of the invention. In this modification, shift registers 51 and 52 are connected in series from an input terminal 50 to define successive taps to which digital multipliers 53, 54 and 55 of a first set are connected, respectively, and digital multipliers 56 and 57 of a second set are connected to those taps to which multipliers 53 and 55 are connected. Multipliers 53, 54 and 55 have tap weight coefficients $d_3$, $d_2$ and $d_1$, respectively, and multipliers 56 and 57 have coefficients $d_1$ and $d_3$, respectively. The outputs of multipliers 53–55 are connected to a first adder 58 to produce the output sequence $A_i$ and the outputs of multipliers 16, 54 and 57 are connected to a second adder 59 to produce the second output sequence $B_i$. The output sequences are alternately sampled at intervals $T=1/f_s$ for half duration T/2 by a switch 60 in response to clock pulses from source 61 for oversampling the incoming signal at twice the symbol rate $f_s$ and multiplexed for application to an output terminal 62. Similar to the first embodiment, shift registers 51 and 52 are clocked at intervals $T=1/f_s$ by clock source 61 so that digital samples are delayed for unit interval T by each of the shift registers.

Successively arriving incoming digital samples at symbol rate $f_s$ are therefore delayed by shift registers 51 and 52, producing samples $a_i$, $a_{i-1}$ and $a_{i-2}$ which are multiplied respectively by multipliers 53–55, producing a weighted output sample $d_3 \times a_i$ from multiplier 53, a second output sample $d_2 \times a_{i-1}$ from multiplier 54, and a third output sample $d_1 \times a_{i-2}$ from multiplier 55. These weighted samples are summed by adder 58 into the output sequence $A_i = d_1 \times a_{i-2} + d_2 a_{i-1} + d_3 \times a_i$.

The foregoing description shows only preferred embodiments of the present invention. Modifications of the invention are apparent to those skilled in the art without departing from the scope of the present invention which is only limited by the appended claims. Therefore, the embodiments shown and described are only illustrative, not restrictive.

What is claimed is:

1. A finite impulse response digital filter including (2n+1) successive virtual taps respectively having virtual tap weight coefficient $c_j$, where $n \geqq 2$ and $1 \leqq j \leqq 2n+1$, and $c_j = c_{2n+2-j}$, said digital filter comprising:

(n+1) tap weight multipliers connected to an input terminal of said digital filter for forming (n+1) successive physical taps and multiplying input digital samples $a_i$ with physical tap weight coefficients $d_k$ to produce weighted digital samples, where $1 \leqq \mathbf{k} \leqq n+1$, and $d_k = c_{2k-1} + c_{2k} = c_{2(n-k+1)} + c_{2(n-k+1)+1}$, and $d_{n+1} = c_1 = c_{2n+1}$, and $a_i$ is an input digital sample at a given instant of time, and $a_{i+1}$ is an input digital sample displaced by an interval T with respect to said digital sample $a_i$, and T is the reciprocal of the symbol rate of said input digital samples;

a first delay-and-adder circuit including a series circuit of first delaying elements and first summing elements alternately series-connected from the output of a first one of said tap weight multipliers, each of said first delaying elements having a delay time T, and said first summing elements summing the outputs of the other tap weight multipliers with successive outputs of the first delaying elements to produce a first output sequence of digital samples $d_1 \times a_{i-n} + d_2 \times a_{i-n+1} + \ldots + d_{n+1} \times a_i$;

a second delay-and-adder circuit including a series circuit of second delaying and second summing elements alternately series-connected from the output of the (n+1)th of said tap weight multipliers, each of said second delaying elements having a delay time T, and said second summing elements summing the outputs of the other tap weight multipliers with successive outputs of said second delaying elements to produce a second output sequence of digital samples $d_{n+1} \times a_{i-n} + d_n \times a_{i-n+1} + d_2 \times a_{i-1} + d_1 \times a_i$; and means for sampling said first output sequence at intervals T for a first half duration and sampling said second output sequence at intervals T for a second half duration and multiplexing the sampled sequences into a single sequence for coupling to an output terminal of said digital filter.

2. A finite impulse response digital filter as claimed in claim 1, wherein each of said delay elements is a shift register clocked at intervals T.

* * * * *

UNITED STATES PATENT AND TRADEMARK OFFICE

CERTIFICATE OF CORRECTION

PATENT NO. : 5,031,133

DATED : July 9, 1991

INVENTOR(S) : Eisaku Sasaki

It is certified that error appears in the above-identified patent and that said Letters Patent is hereby corrected as shown below:

On the title page:

Abstract, line 10, delete "$C_2$(n-k+1)" insert -- $c_2$(n-k+1)--

Col. 1, line 57, delte "(n-k+1)+1" insert -- (n-k+1)+1' --

Signed and Sealed this

Third Day of November, 1992

Attest:

DOUGLAS B. COMER

Attesting Officer

Acting Commissioner of Patents and Trademarks